United States Patent [19]

Conolly et al.

[11] Patent Number: 5,189,371
[45] Date of Patent: Feb. 23, 1993

[54] METHOD AND MEANS FOR MAGNETIC RESONANCE IMAGING AND SPECTROSCOPY USING TWO-DIMENSIONAL SELECTIVE ADIABATIC PI PULSES

[75] Inventors: Steven M. Conolly; John M. Pauly, both of Menlo Park, Calif.

[73] Assignee: The Board of Trustees of the Leland Stanford Junior University, Stanford, Calif.

[21] Appl. No.: 742,785

[22] Filed: Aug. 8, 1991

[51] Int. Cl.⁵ ............................................. G01R 33/20
[52] U.S. Cl. .................................. 324/309; 324/307
[58] Field of Search ............... 324/300, 303, 306, 307, 324/309, 310, 311, 312, 313, 314, 318, 322; 128/653.2, 653.5

[56] References Cited

U.S. PATENT DOCUMENTS

| 4,528,508 | 7/1985 | Vail, III | 324/303 |
| 4,565,968 | 1/1986 | Macovski | 324/309 |
| 4,577,152 | 3/1986 | Macovski | 324/309 |
| 4,579,121 | 4/1986 | Macovski | 128/653 |
| 4,656,422 | 4/1987 | Vail, III et al. | 324/303 |
| 4,665,366 | 5/1987 | Macovski | 324/309 |
| 4,792,757 | 12/1988 | Vail, III et al. | 324/303 |
| 5,057,776 | 10/1991 | Macovski | 324/309 |

OTHER PUBLICATIONS

Steven Conolly, et al. "Two-Dimensional Selective Adabatic π Pulses," (Abstract) *Proc. SMRM*, 1X, Aug. 18, 1990, p. 418, New York.
Steven Conolly, et al., "Two-Dimensional Selective Adabatic π Pulses," (Unpublished).

*Primary Examiner*—Michael J. Tokar
*Attorney, Agent, or Firm*—Townsend and Townsend

[57] ABSTRACT

Two-dimensional selective adiabatic pulses invert magnetization from a square region in the xy plane with insensitivity to RF variations. Two-dimensional adiabatic pulses can also invert selectively in frequency and in one spatial dimension. The pulses are useful for both MR imaging and spectroscopy.

13 Claims, 19 Drawing Sheets

METHOD AND MEANS FOR MAGNETIC RESONANCE IMAGING AND SPECTROSCOPY USING TWO-DIMENSIONAL SELECTIVE ADIABATIC PI PULSES

BACKGROUND OF THE INVENTION

The U.S. Government has rights in this invention pursuant to National Institute of Health grants HL-39297.

This invention relates generally to magnetic resonance imaging, and more particularly the invention relates to spin-echo imaging using hyperbolic secant pulses.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

A descriptive series of papers on NMR appeared in the June 1980 issue of the IEEE Transactions on Nuclear Science, vol. NS-27, pp. 1220–1255. The basic concepts are described in the lead article, "Introduction to the Principles of NMR," by W. V. House, pp. 1220–1226, which employ computed tomography reconstruction concepts for reconstructing cross-sectional images A number of two-and three-dimensional imaging methods are described. Medical applications of NMR are discussed by Pykett in "NMR Imaging in Medicine," Scientific American, May 1982, pp. 78–88, and by Mansfield and Morris, NMR Imaging in Biomedicine, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_0$, of the precession of the nuclei is the product of the magnetic field $B_0$, and the so-called magnetogyric ratio, $\gamma$, a fundamental physical constant for each nuclear species:

$$\omega_0 = B_0 \cdot \gamma$$

Accordingly, by superimposing a linear gradient field, $B_z = Z \cdot G_z$, on the static uniform field, $B_0$, which defined Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

Due to inhomogeneity of the static field and due to the gradient fields, nuclei spins in a selected slice can become dephased due to difference in precession frequency. The spin-echo technique has been introduced to overcome the dephasing the spins. Briefly, after applying an initial 90-degree pulse to flip spins at a right angle to the static and gradient field, and 180-degree pulse is applied to turn the dephased spins over into a mirror-image position. The 180-degree pulse is applied after a time period, $\tau$, following the initial 90-degree pulse. After a time period, $2\tau$, following the initial 90-degree pulse, the spins are refocused and create a "spin echo" which can be sensed for imaging purposes.

Heretofore, adiabatic (180-degree) pulses have been used to invert spins in the presence of both RF and $B_0$ inhomogeneity. Hioe and Silver et al., Physical Review 1984, independently determined that the Bloch equation admits an analytic solution when driven by the complex hyperbolic secant pulse. Moreover, they discovered that the pulse inverts spins at any pulse amplitude exceeding a threshold. This insensitivity to RF variations makes adiabatic pulses appealing for both MR imaging and spectroscopy.

Two-dimensional selective excitation pulses computed by simulated annealing techniques was reported by Hardy et al. in "Proc. Sixth SMRM", p. 479, August 1987, and Journal of Magnetic Resonance, 77, 233–250, (1988). The k-space analysis of Pauly et al. Magnetic Resonance, 81, 43–56 (January 1989), showed that to first order an RF pulse's energy is deposited in excitation k space along a trajectory determined by the integral of the gradient waveforms, and that the slice profile is then the Fourier transform of that weighted trajectory. Hardy et al. designed several two-dimensional pulses in Journal of Magnetic Resonance, 82, (May 1989), using k-space analysis, including some variable-rate RF and gradient waveforms that accommodate gradient slew-rate constraints. Lee and Cho, Magnetic Resonance in Medicine, 12, 56–63, (October 1989), designed a three-dimensional RF pulse using k-space analysis. They employed a non-linear gradient in $\rho$ and a conventional gradient in z. Cline et al. "Proc. Eighth SMRM", p. 365, August 1989, used a two-dimensional RF pulse to perform cardiac velocity profiling. In Journal of Magnetic Resonance, 82, 571–587, (May 1989), Pauly et al. described several "inherently refocused" trajectories through excitation k space that admit Fourier transform solutions of the Bloch equation even for large rotation angles. Meyer et al. designed two-dimensional pulses based on excitation k-space concepts that select simultaneously in space and frequency in Magnetic Resonance in Medicine, 15, 287–304, (August 1990). In "Proc. Eighth SMRM", p. 862, August 1989, Pauly et al. proposed a "separable" pulse design technique for the echo-planar k-space trajectory, for which the Fourier solution was invalid. The separable solution prescribes a sequence of Fourier transform pulses in the fast gradient direction, where each pulse rotation in the sequence is determined by the full non-linear inversion of the Bloch equation, which is most efficiently solved numerically by the Shinnar-Le Roux (SLR) algorithm (see Magnetic Resonance in Medicine, 12, 74–98, October 1989). Hardy et al., Journal of Magnetic Resonance, 87, 639–645, (1990), discloses a correction for the RF weighting when k space is sampled non-uniformly.

SUMMARY OF THE INVENTION

An object of the invention is a method of and apparatus for NMR imaging and spectroscopy using a two-dimensional selective adiabatic pulse.

Another object of the invention is use of a two-dimensional adiabatic pulse that inverts selectively in frequency and in one spatial dimension.

A feature of the invention is an adiabatic fast passage (AFP) pulse comprising a plurality of spatially selective pulses which are separated by small pulses or "blips" of the y gradient field.

Briefly, using the technique of separable k-space excitation, we have designed a selective adiabatic fast passage (AFP) pulse that inverts magnetization in a square region in the xy plane with insensitivity to RF variations. In a preferred embodiment, we typically use a sequence of sixteen x-selective pulses, each with an identical slice shape but with a different rotation angle. Each is separated by a "blip" in the y gradient which defines the echo-planar trajectory. The rotation angles for the sixteen pulses are determined by sixteen samples taken from a standard one-dimensional adiabatic pulse. Hence, the pulse performs a (periodic) inversion along y for any x where the rotations are of sufficient strength to cause an adiabatic inversion. It is a surprising and important side result that a sixteen-point AFP hard pulse demonstrates adiabatic character. Indeed, this result should be considered in the light of significant effort in the design of composite hard pulses.

The pulses are useful for both MR imaging and spectroscopy. Although designed for inversions only, it is possible to concatenate two pulses to generate a spin echo with insensitivity to RF variations. Experimental results demonstrate that the two-dimensional adiabatic pulses are feasible on commercial imaging systems.

The invention and objects and features thereof will be more readily apparent from the following detailed description and appended claims when taken with the drawings.

The invention and objects and features thereof will be more readily apparent from the following detailed description and appended claims when taken with the drawings.

DETAILED DESCRIPTION OF ILLUSTRATIVE EMBODIMENTS

Figure 1A:
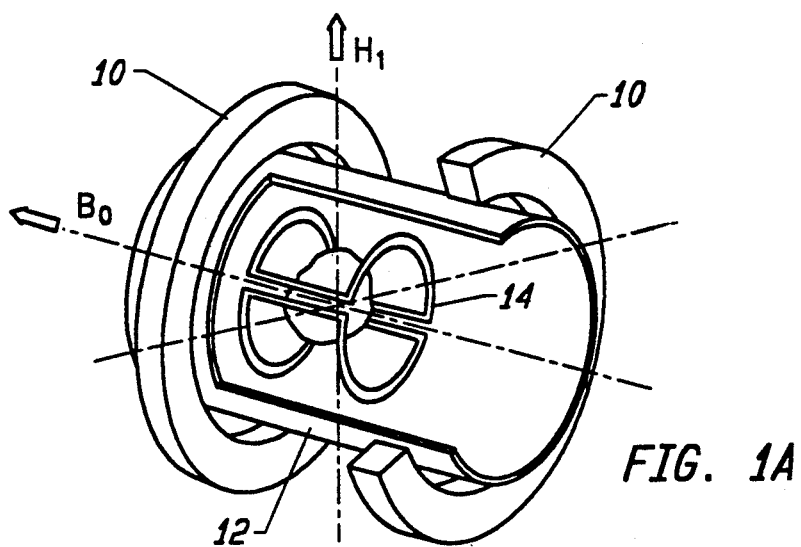
FIGS. 1A–1D illustrate the arrangement of MRI apparatus and magnetic fields generated therein.
Figure 1B:
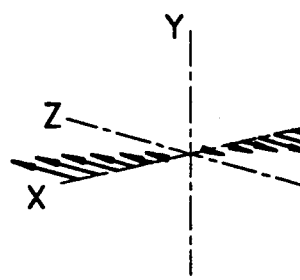
Figure 1C:
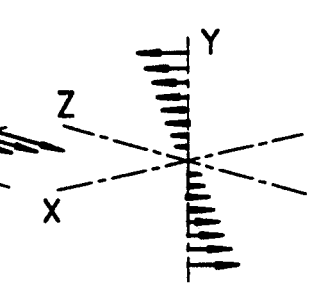
Figure 1D:
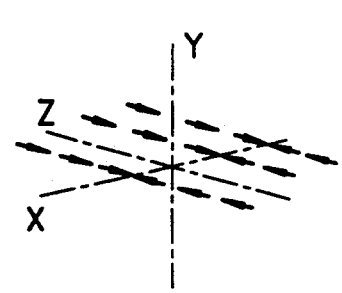

Referring now to the drawing, FIG. 1A is a perspective view partially in section illustrating coil apparatus in NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338-350. Briefly, the uniform static field $B_0$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

Figure 2:
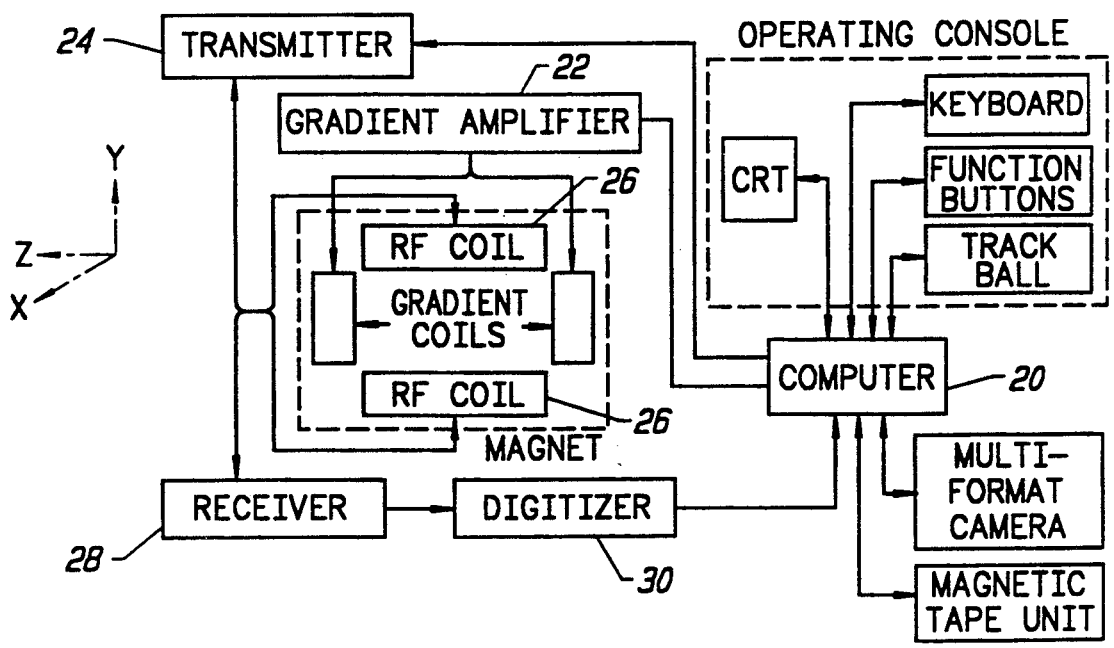
FIG. 2 is a functional clock diagram of MR imaging apparatus.

FIG. 2 is a functional block diagram of the imaging apparatus as disclosed in NMR -A Perspective on Imaging, General Electric Company, 1982. A computer 20 is programmed to control the operation of the NMR apparatus and process FID signals detected therefrom. The gradient field is energized by a gradient amplifier 22, and the Rf coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
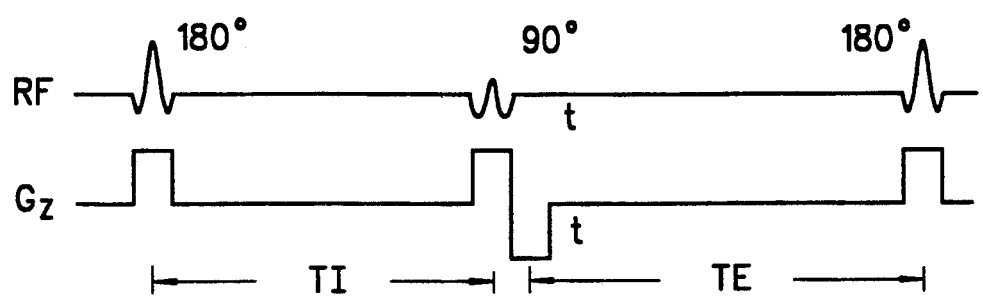
FIG. 3 illustrates a basic pulse sequence for exciting a slab for projection image.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween.

In accordance with the invention, a selective adiabatic fast passage (AFP) pulse is provided which inverts magnetization in a square region in the xy plane with insensitivity to RF variations. The two-dimensional adiabatic pulses can also simultaneously select in frequency and one spatial dimension.

Before describing the two spatial dimension pulse, first consider the sampling of soft pulses. Using conventional terminology we consider a pulse "soft" if the RF and gradient (or off-resonant) field are applied simultaneously. We consider a pulse sequence "hard" if the gradient field is off (or negligible) during the RF pulse. A sampled version of a soft pulse is a sequence of hard pulses whose areas are chosen from samples of the soft pulse waveform.

Figure 4A:
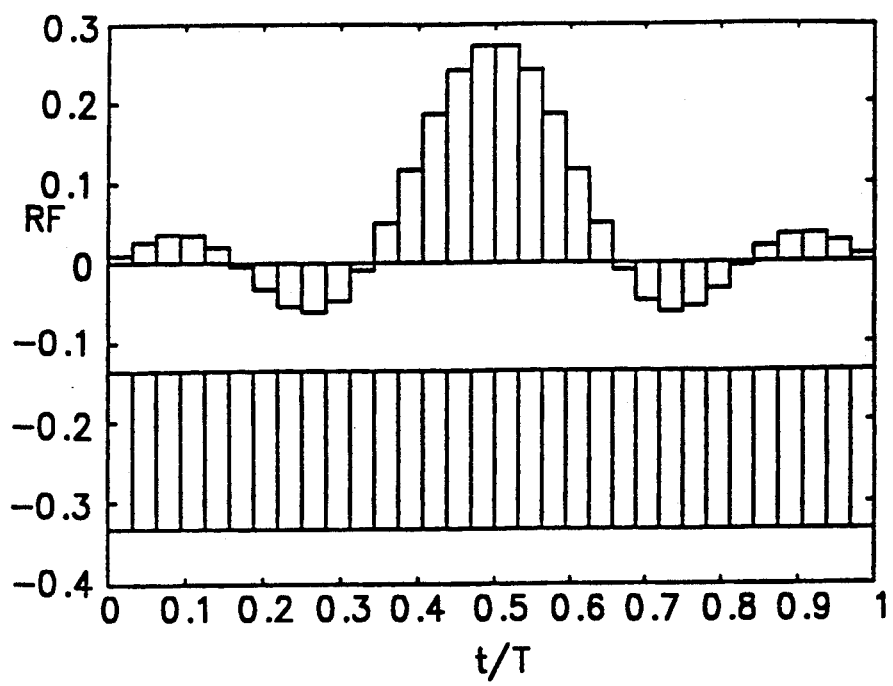
FIG. 4A illustrates a soft sinc pulse.
Figure 4B:
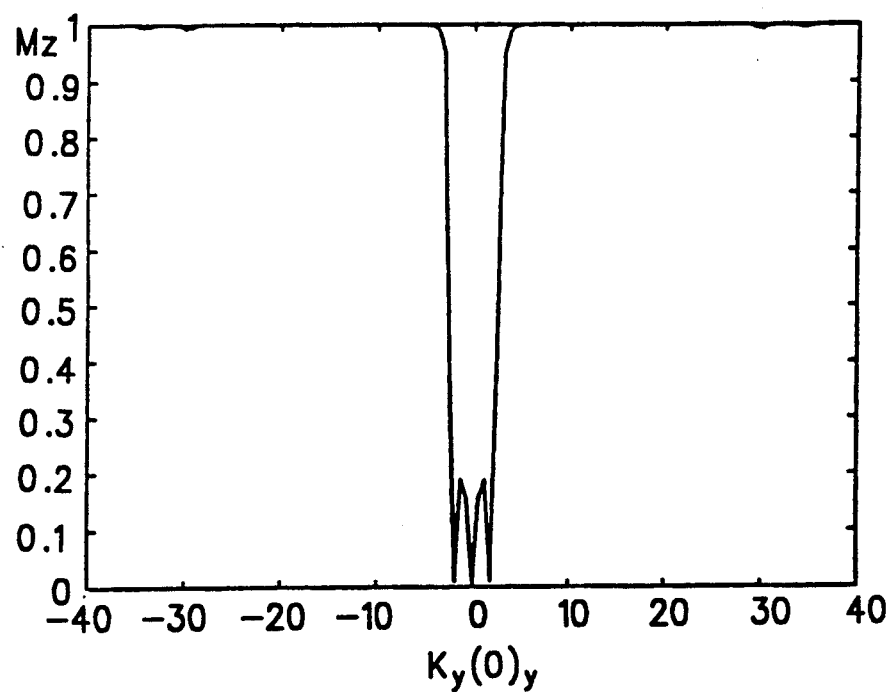
FIG. 4B illustrates the simulated inversion profile of the soft sinc pulse shown in FIG. 4A.
Figure 4C:
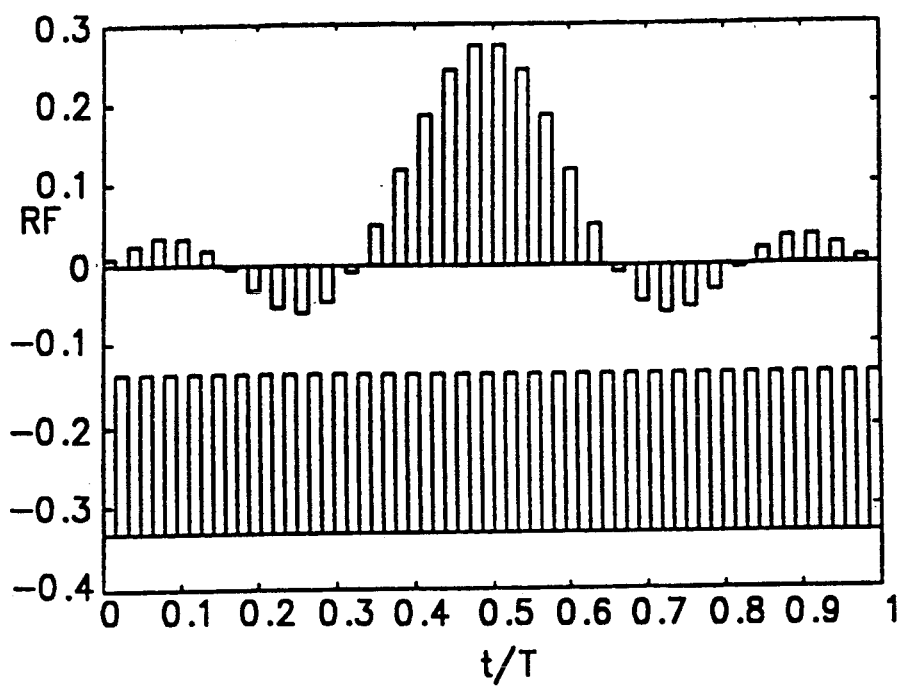
FIG. 4C illustrates a sampled version of the soft pulse of FIG. 1A. (N=32)
Figure 4D:
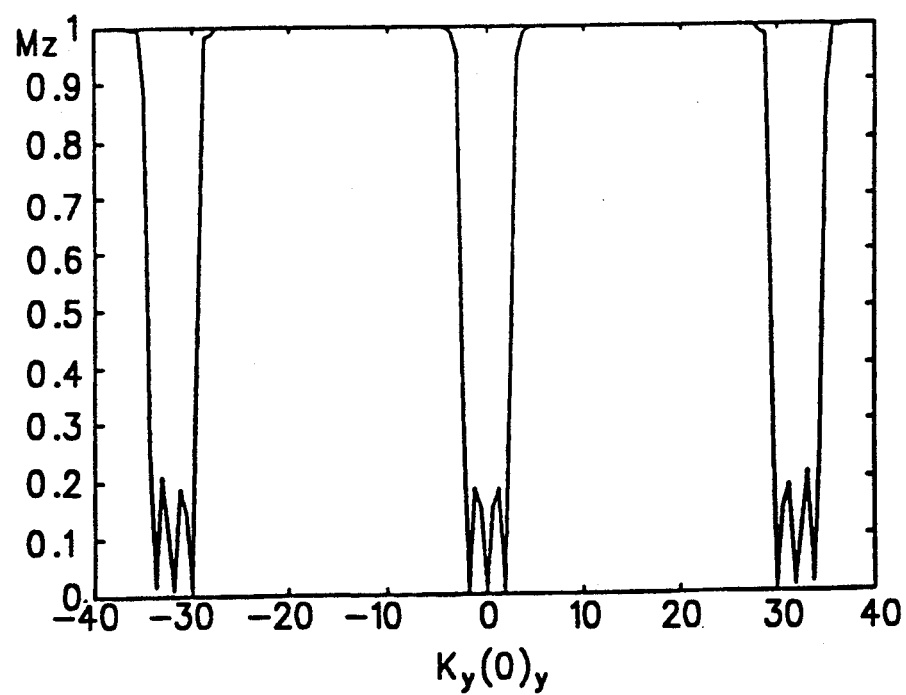
FIG. 4D illustrates the simulated inversion profile of the sampled pulse shown in FIG. 4C.

To understand two-dimensional adiabatic pulses, we first need to characterize the response to a sampled AFP pulse. The small-tip Fourier solution to the Bloch equation suggests that a sampled pulse should excite a replicated version of the soft pulse's magnetization profile. In general, one can show that the response to any sampled pulse sequence is periodic. In FIG. 4 we compare a soft pulse and its slice profile (FIG. 4A, 4B) with a sampled version of the pulse and its profile (FIG. 4C-4D). Note that the Fourier sampling theorem seems to hold very well for this sinc pulse. It was not obvious whether this "sampling theorem" would hold for adiabatic pulses. Indeed, it is surprising that the response to a sampled AFP pulse is very similar to the periodic extension of the soft pulse response since adiabatic pulses have extremely non-linear responses.

Figure 5A:
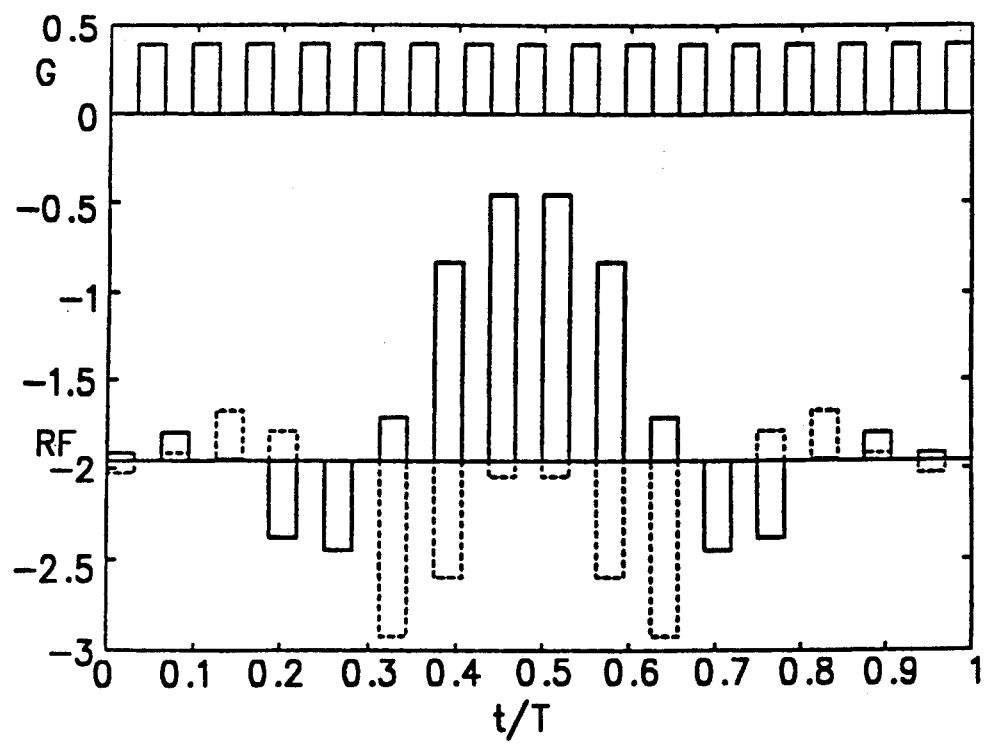
FIG. 5A illustrates a sampled version of a sech pulse. (N=16)
Figure 5B:
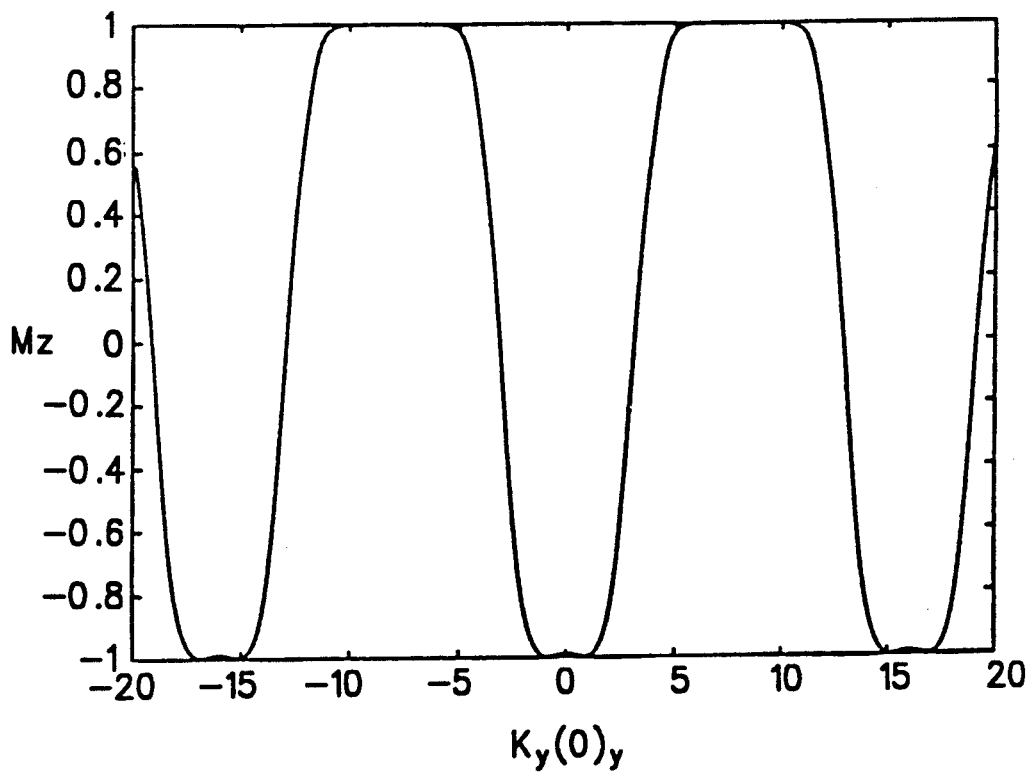
FIG. 5B illustrates the simple inversion profile of the sampled pulse shown in FIG. 5A.

In FIGS. 5A and 5B, we show a sampled sech pulse and its inversion profile. Note that the sampled response approximates the periodic extension of the soft response. We can determine the period by the following argument. The total rotation is the product of a sequence of rotations about the x-axis due to the RF separated by identical precessions about the z-axis, each through the angle $2\pi y k_y(0)/N$, where N is the total number of samples in the RF, and $k_y(0)$ is proportional to the total area of the gradient:

$$k_y(0) = -(\gamma/2\pi)\int_0^T G_2(\tau)d\tau, \qquad [1]$$

where T is the pulse's total duration. Because any rotation is identical modulo $2\pi$, the total rotation is periodic with period $N/k_y(0)$. Note that the period increases with the sampling fineness, N. This fact will be important when we wish to place all replicated inversion regions outside of the body. As with any one-dimensional pulse in the presence of a time-varying gradient, the spatial width of the inversion profile is determined by the ratio, $W_y = F_y T/k_y(0)$, where $F_y$ represents the soft pulse's bandwidth.

Figure 6:
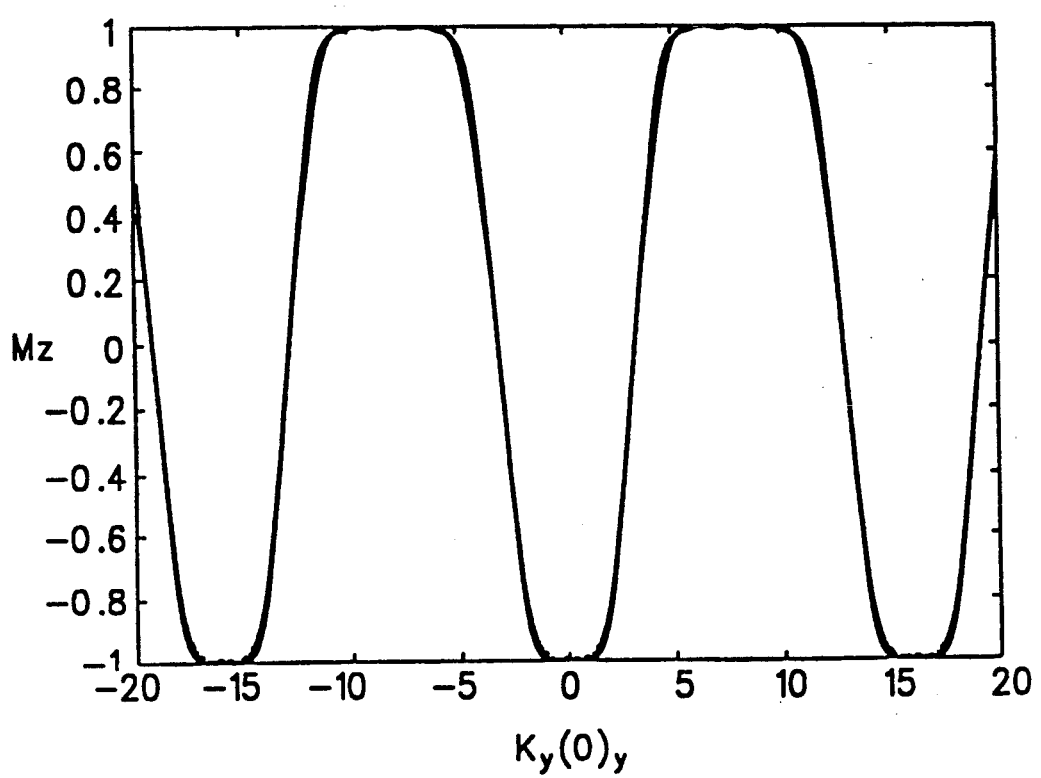
FIG. 6 illustrates a demonstration of the insensitivity to RF amplitude variations of the sampled sech pulse of FIG. 5B. The RF amplitude ranges from 20% higher than the nominal inversion amplitude to twice the nominal amplitude. Note that the inversion profile is very insensitive to this range of amplitude variation.

Perhaps most surprising is the fact that sampled sech pulse retains its adiabatic insensitivity to RF amplitude variations. FIG. 6 shows the simulated response to a 16-point sech pulse over a range of RF amplitudes.

Often one wishes to invert exclusively a certain metabolite that lies in a narrow chemical shift range. This inversion requires a soft pulse of duration greater than 25 ms. On some commercial imaging systems, unblanking of the RF amplifier for such an extended duration is problematic. Hence, a sampled version of the soft sech pulse would be an attractive alternative, especially given its insensitivity to RF variations. A sampled sech pulse should be considered as a simple and effective alternative to composite $\pi$ pulses. An even number of adiabatic $\pi$ pulses should always be used to collect spin echoes.

EXTENSION TO TWO SPATIAL DIMENSIONS

So far we have considered only a sampled sech pulse- a sequence of hard pulses separated by pulses of the y gradient. We found that the profile is periodic as a function of y. Suppose each of the hard rotations was made a selective rotation in x, for example, by making each a Gaussian slice:

$$\theta_n(X) = \theta_n e^{-\pi x^2/W^2_x} \qquad [2]$$

Figure 7A:
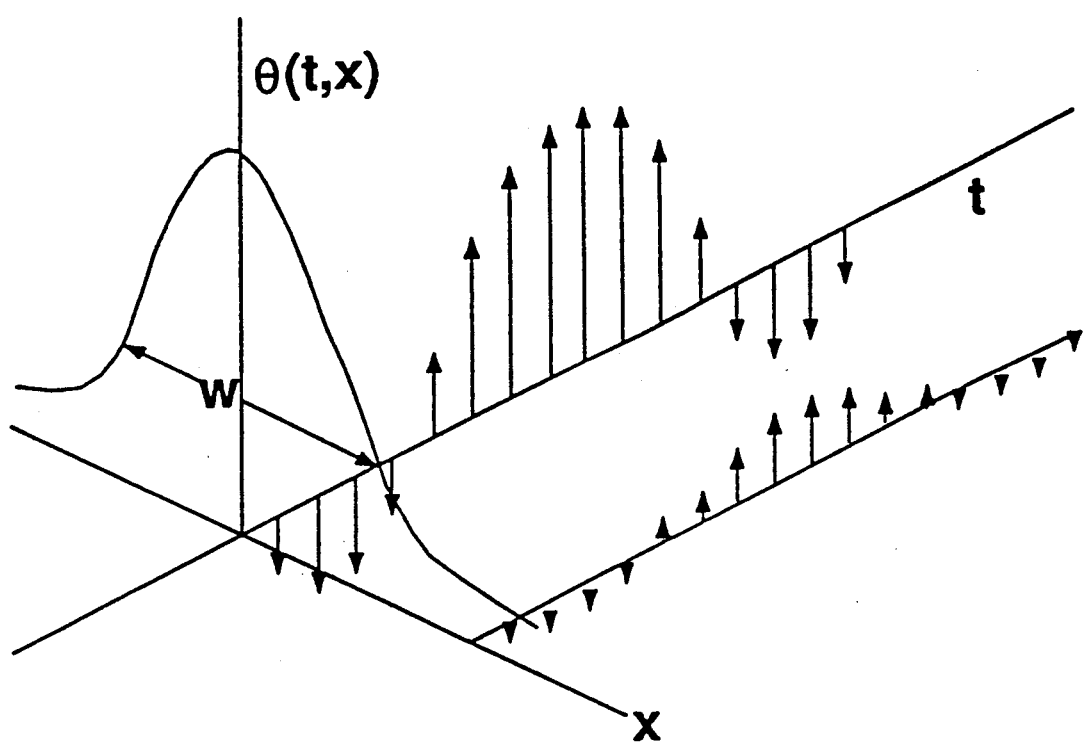
FIG. 7A illustrates the effect of making each of the hard pulses selective in x. For x=0, the response along y is the periodic extension of the soft pulse response. For $|x| > W_x$, no inversion takes place because each of the sub-pulses performs no rotation.

FIG. 7A demonstrates the effect of making the hard pulses selective in x. We will discuss the choice of the x profile in more detail below.

Figure 7B:
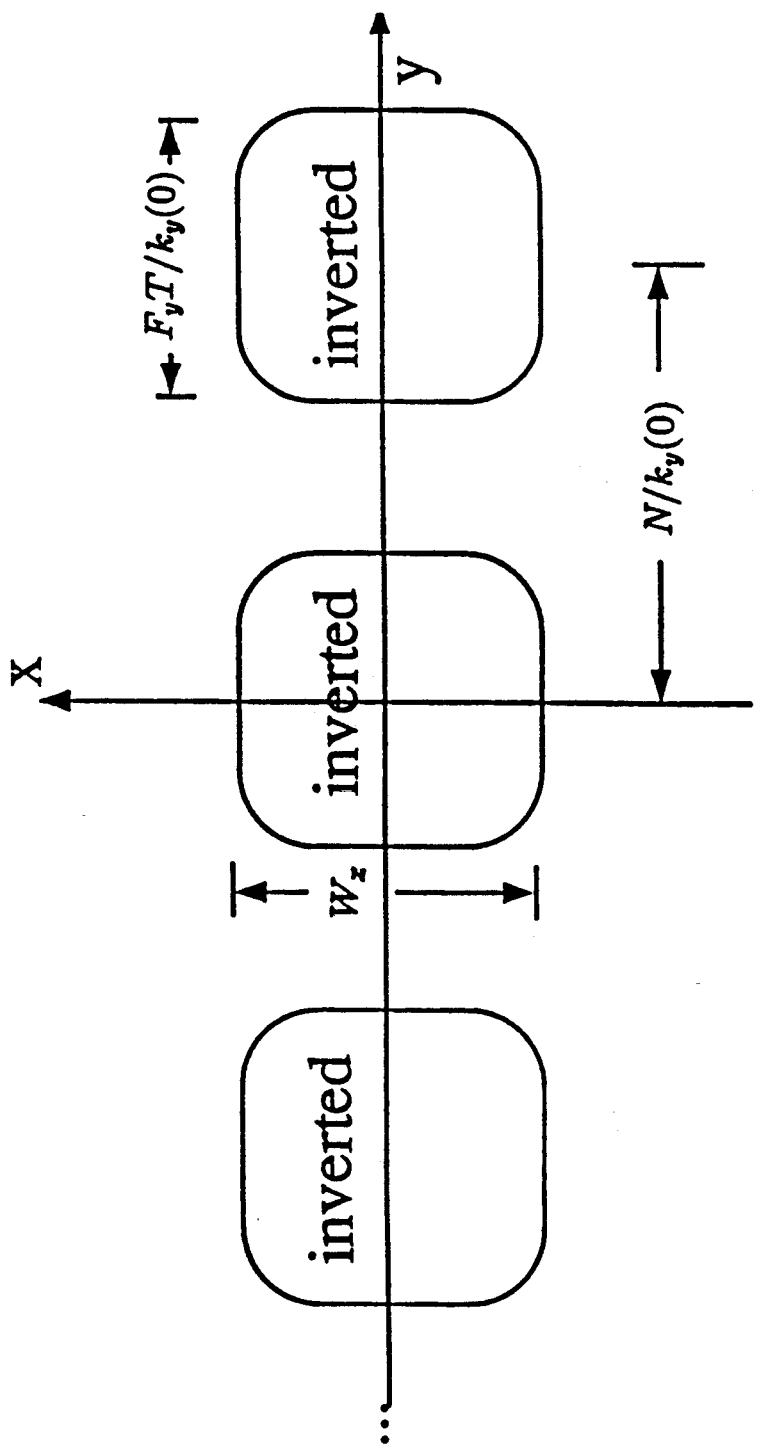
FIG. 7B illustrates the two-dimensional inversion profile predicted by the qualitative analysis afforded by FIG. 7A. Note that there is no replication in the x direction.

It is simplest to envision the two-dimensional response by fixing the variable x, and then determining the one-dimensional response as a function of y. Near $x=0$, the response along y must be the same as for the one-dimensional case. For x different from zero, the response along y is identical to the response to the sampled pulse sequence played at amplitude $e^{-\pi x^2/W^2_x}$. For $|x| >> W_x$, the "amplitude" of the sampled pulse sequence will be insufficient to invert any magnetization. FIG. 7B shows the inverted regions based on this analysis. Note that the periodic nature of the one-dimensional response is retained in the y direction. There is no replication in the x direction.

Figure 8A:
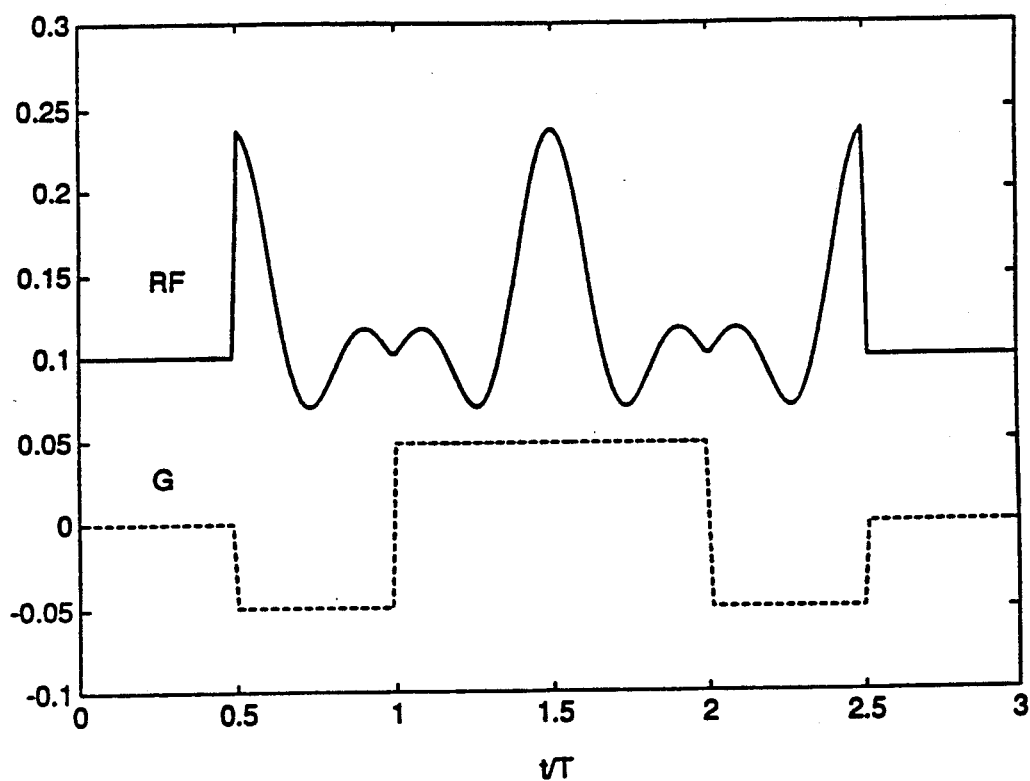
FIG. 8A illustrates the RF and gradient waveforms for an inherently refocused pulse (IRP). Unlike a standard excitation pulse, no refocusing is required after an IRP.
Figure 8B:
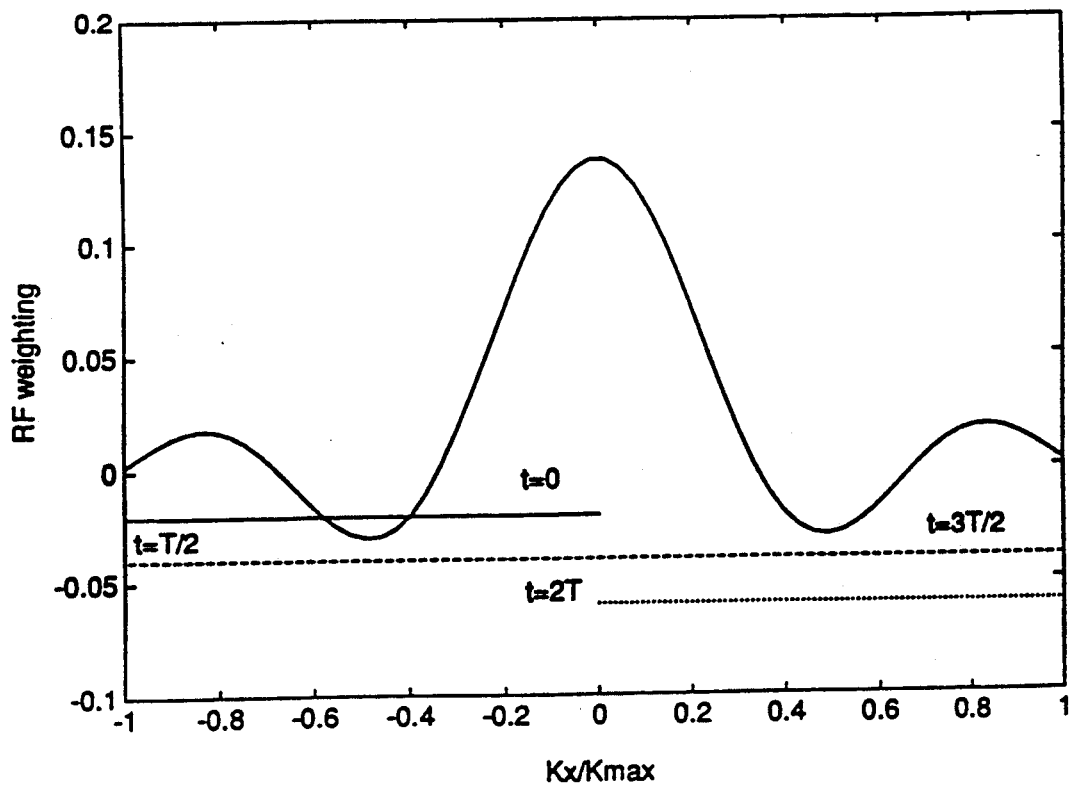
FIG. 8B illustrates the deposition of energy in $k_x$ space associated with FIG. 8A. Note that each half of the sinc pulse is traced twice. Hence, the amplitude of the IRP is half as great as the conventional excitation pulse, and the duration of the IRP is twice as long.

It now remains to design a sequence of x-selective pulses. The principal problem is refocusing the magnetization after each pulse while observing gradient slew-rate constraints. The first problem is answered by an inherently refocused pulse (IRP), which was introduced by Pauly, et al., reference 7. The basic IRP is shown in FIG. 8A. Note that the gradient is negative for a period $\tau$, positive for a period $2\tau$, an negative again for a period $\tau$. Recalling the definition of the k-space trajectory, $$k(t) = -\gamma/2\pi \int_t^T G(\sigma)d\sigma, \qquad [3]$$

we depict its associated traversal through excitation k space in FIG. 8B. Unlike a standard excitation pulse, this IRP requires no refocusing.

Figure 9A:
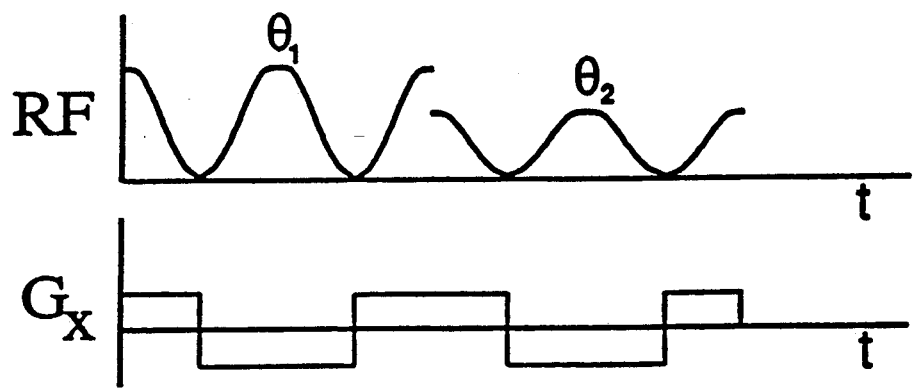
FIG. 9A illustrates a sequence of N inherently refocused pulses (IRPs) to perform the two-dimensional inversion. The y gradient is not shown in this figure.
Figure 9B:
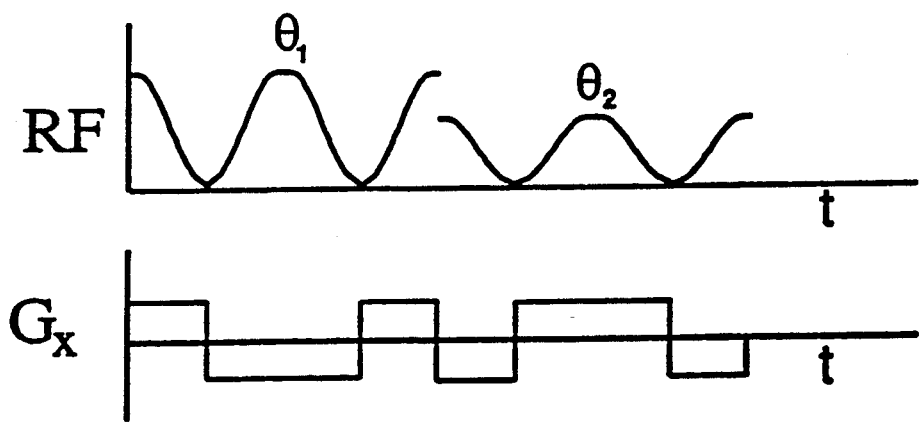
FIG. 9B illustrates the gradient sign alternated for every other IRP. Since the response is symmetric along x, this should produce no artifact. This alternative suggests the next step, which is to concentrate both traces of the IRP into the central lobes. This allows for cancellation of adjacent gradient lobes between RF pulses, which saves considerable amounts of time.

For the full two-dimensional design, we could concatenate a series of IRP's separated by y-gradient lobes, which is sketched in FIG. 9A. An alternative design is shown in FIG. 9B, where the sign of the gradient is inverted for every other IRP. This gradient reversal should produce no artifact except a mild chemical shift sensitivity. This alternative design makes clear the next step, which is to concentrate each RF pulse into the center of the IRP, and then allow adjacent gradient lobes to cancel each other, which saves considerable amounts of time. This operation leaves us with the ideal pulse sequence, shown in FIG. 9C.

Figure 9C:
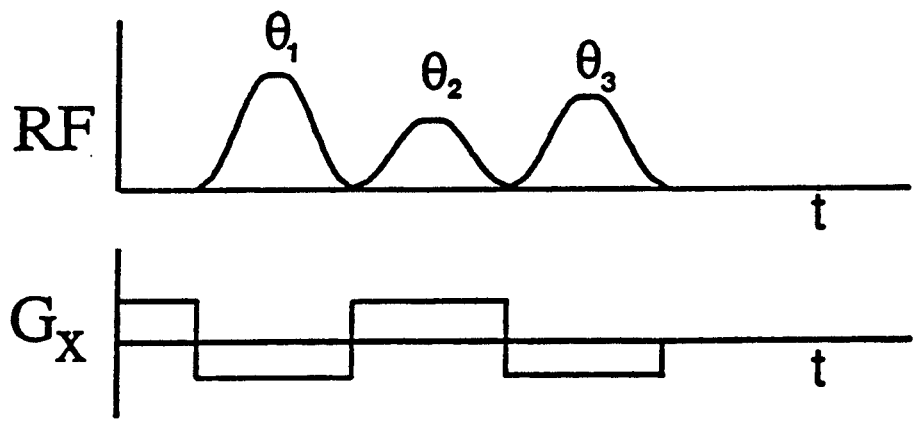
FIG. 9C illustrates the ideal sequence of IRPs, which evolved from the design of FIG. 9B. Note that this gradient waveform requires infinite bandwidth.
Figure 9D:
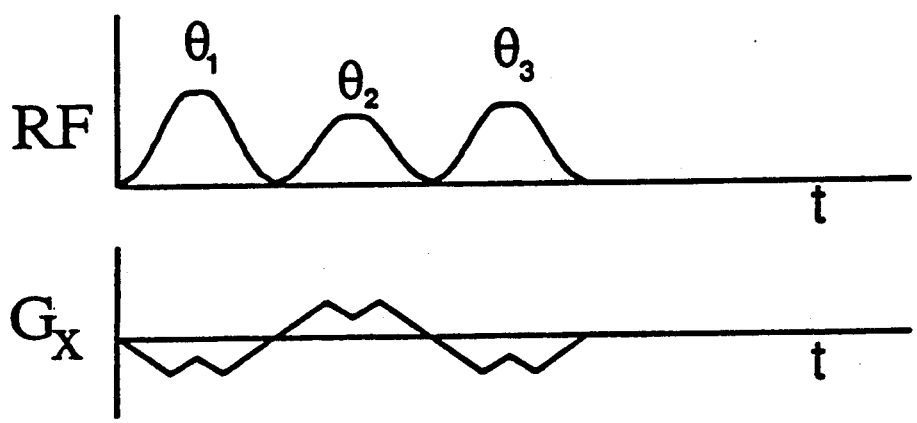
FIG. 9D illustrates the practical embodiment of FIG. 9C. Finite rise times on the gradient and RF power limitations suggest this "W" shaped waveform. The RF waveform needs to be adjusted to accommodate this variable-rate gradient waveform. The y gradient "blips" are placed at the nulls of the x gradient. Since the RF energy during these blips is very small, we ignore this shortcut in adjusting the RF waveform to the variable-rate x gradient.

Of course, any real gradient has insufficient bandwidth to slew as shown in FIG. 9C. If we modify the constant gradient lobes, then we must vary the schedule of RF energy deposition accordingly, which is prescribed by both the k-space analysis and by variable-rate selective excitation. The slew-rate constraint suggests a periodic triangular waveform, since it would traverse k space quickest given the constraint. However, this is a unfortunate choice in terms of RF power deposition since the variable-rate RF would be very peaked at the center. A compromise is struck with the piece-wise linear waveform shown in FIG. 9D, which resembles the letter "W". The center of the gradient lobe is depressed to reduce power deposition and peak amplitude. Each of the piece-wise linear segments is sloped at the slew-rate constraints, in order to minimize slice thickness. This design trades a 50% reduction in peak RF amplitude for a 12.5% increase in the slice width.

In practice, we run the y-gradient lobes during the RF to save time. Presumably because its duration is sufficiently short, we have observed no artifacts from this shortcut. On a standard GE Signa 1.5 T system with shielded gradients, the slew-rate constraint is about 2G/(cm ms). Because the peak gradient is 1 G/cm, every sample adds about a millisecond to the total pulse duration. Hence, an N-sample pulses is about N ms in duration. Of course, the minimum width for an x-selective pulse of duration 1 ms is fairly large; we have achieved 3.2 cm × 3.2 cm square region using half of the peak gradient amplitude.

DETAILS OF THE IRP SLICE PROFILE

Above we used as example a Gaussian slice profile in the x direction; however, the "optimal" slice profile is not apparent. The Gaussian slice is convenient because the RF waveform is never negative, which reduces its power. However, suppose we want to invert all spins within the half-max rotation to be inverted. Then most of the center region is being rotated far more than necessary for an inversion. Extending this argument, a rectangular profile offers the most efficient use of RF power, since then no part of the slice profile grossly exceeds the "on" threshold. Indeed, this can be proved for the small-tip case using Rayleigh's Theorem. For a sixteen-pulse sech, it turns out that some of the individual pulses rotate about sixty degrees, which is out of the linear regime. For a 32-point sech, the pulses are all linear, and Fourier design is perfectly adequate. We tried Fourier design for a 16-sinc 2D sech with somewhat disappointing results, apparently due to the geometrical differences in slice profile with rotation angle. After designing each of the inherently refocused pulses with the Shinnar-Le Roux (SLR) algorithm, the x slice profiles fit together very well. All of the results shown herein employ SLR pulses, which deliver remarkably rectangular slice profiles and require only a few CPU seconds to design.

SUMMARY OF 2D AFP PULSE DESIGN

Below we list the steps required to generate a 2D adiabatic pulse.

1. Determine the number of sample points, N. One must tradeoff slice width, RF power, side lobe separation width, and duration, while keeping in mind peak power and gradient slew-rate constraints. For our system, it reduces to finding the minimal number of samples sufficient to put the side lobes just far enough out to be useful. The slew-rate constraints then determine the minimum duration to be about N ms. Usually this is rather long by selective pulse standards.

2. Take N uniformly-spaced samples from a soft adiabatic pulse. Re-normalize so that the area of the N samples is the same as the area of the original soft pulse. Simulate its one-dimensional slice profile to check that it is working.

3. Design N selective RF pulses that perform rotations according to the samples above. We recommend the SLR algorithm for this step, but Fourier design is not prohibited. Rectangular profiles are recommended but not essential. Of course, exploit the symmetry of the AFP pulse; one really only needs to design N/2 pulses.

4. Construct one period of the x gradient waveform, incorporating the gradient constraints. It should look somewhat like the "W" waveform discussed above, but could be triangular if there are no RF power constraints.

5. Using the variable-rate theorem, re-fabricate the RF pulses in accordance with the x gradient waveform so that the energy deposited in k space produces the excitation profile wanted. (Note that the y gradient is ignored here.)

6. Concatenate the pulses and place y gradient lobes at the nulls of the x gradient. The total area of the y gradient should be equal to the area of one lobe of the x gradient to achieve a square coverage of k space.

7. Simulate the pulse along both x and y before attempting a full 2D simulation or an experiment. Insufficient RF amplitude problems are more apparent in the simulation along the x axis.

8. Insure that the replication side lobes are outside of the field-of-view before imaging.

Figure 10:
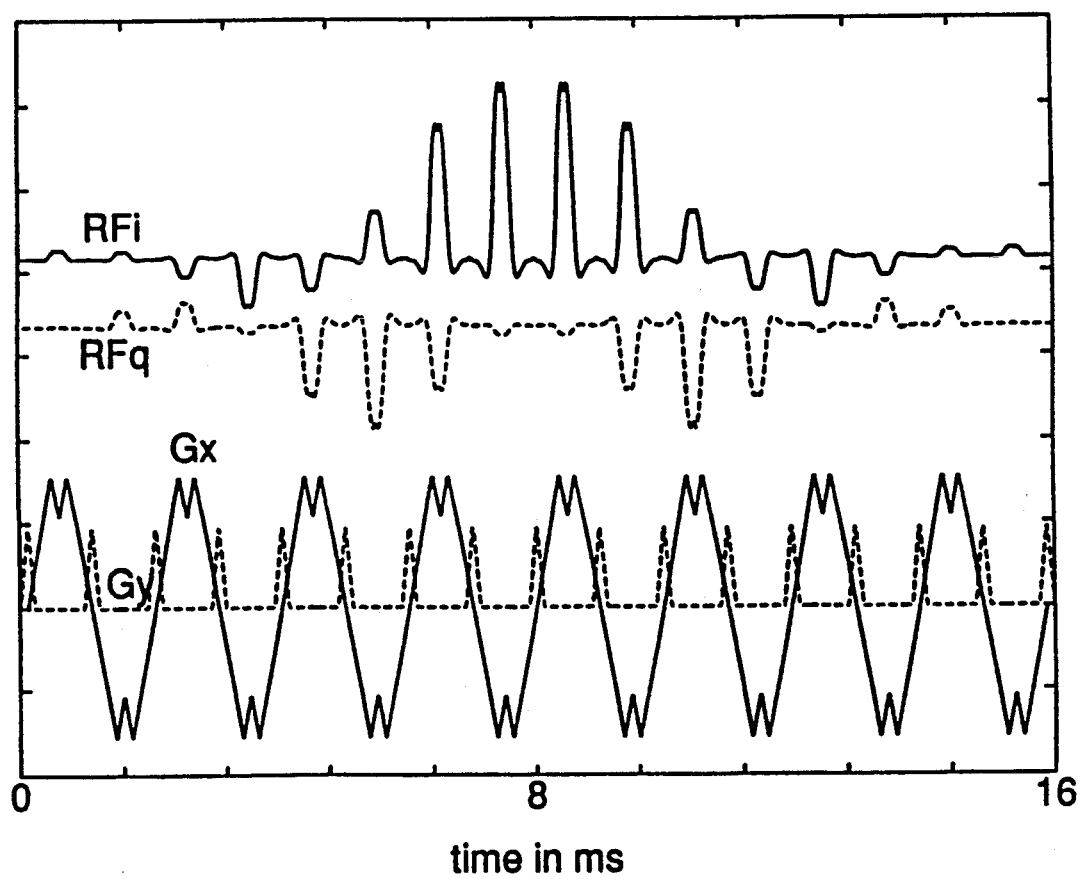
FIG. 10 illustrates a sixteen-point, two-dimensional AFP RF pulse and its gradient waveforms. Each sub-pulse was designed with Shinnar-Le Roux algorithm.
Figure 11:
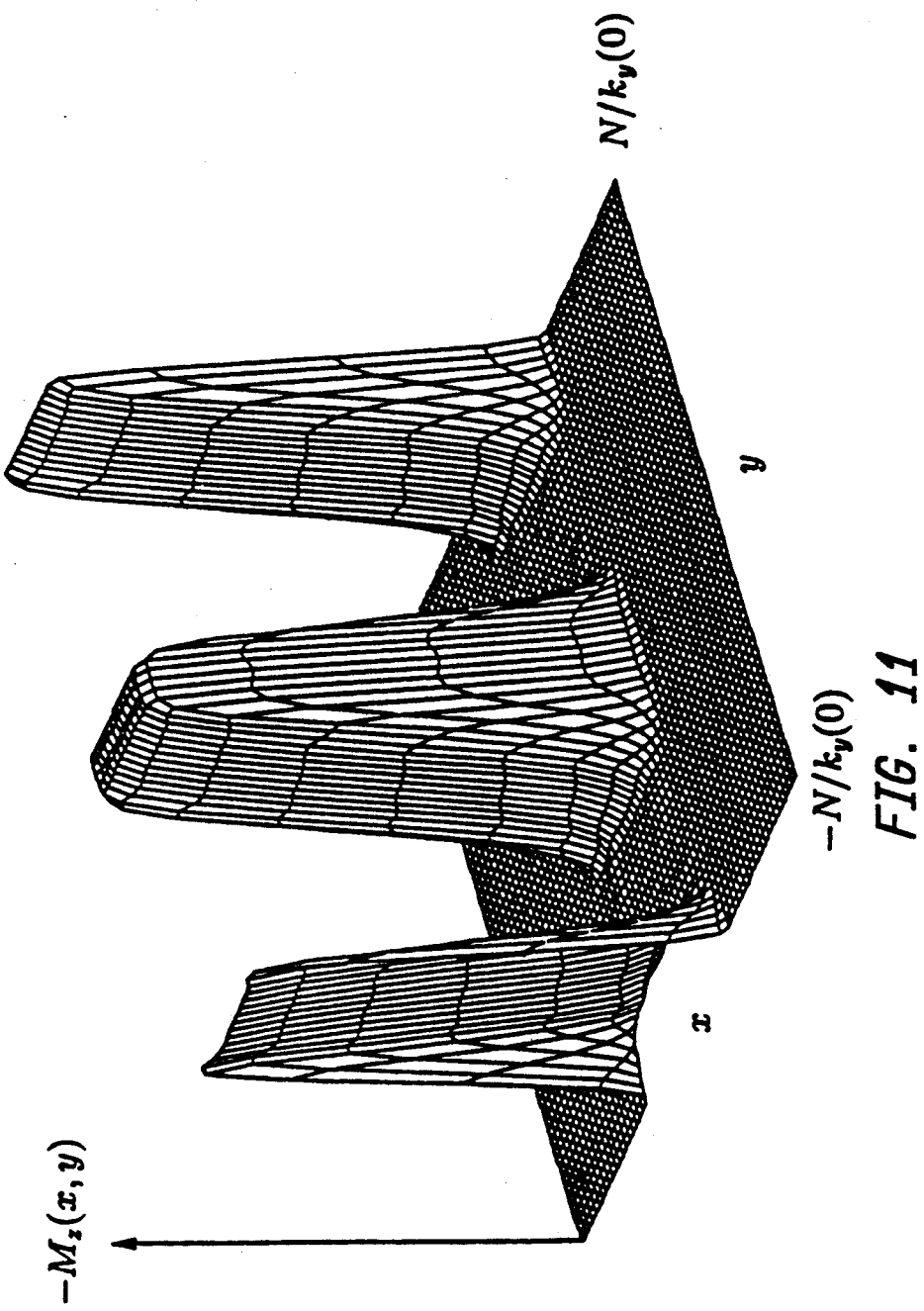
FIG. 11 illustrates the two-dimensional simulation of the pulse shown in FIG. 10. Note that the pulse is sharper in the x direction than in the y direction.

FIG. 10 shows the complete RF and gradient waveform designed using SLR sub-pulses. FIG. 11 shows the simulated 2D inversion profile.

SPECTRAL-SPATIAL ADIABATIC PULSES

Spectral-spatial pulses are two-dimensional pulses that select simultaneously in frequency and one spatial coordinate. The first spectral-spatial pulse was designed by Meyer et al., Magnetic Resonance in Medicine, 15, 287–304, (August 1990), using a small-tip k-space analysis. Since then, Pauly et al., "Proc. Eighth SMRM", p. 862, August 1989, have designed spectral-spatial pulses well into the non-linear regime using the Shinnar-Le Roux algorithm.

To generate an adiabatic spectral-spatial pulse, we simply turn off the slow y gradient. In effect, we are substituting the constant off-resonance field for the pulsed y gradient field. This substitution violates the hard-pulse assumption since the off-resonance field remains on during the RF pulses. Hence, spectral-spatial pulses produce distinctive artifacts relative to their 2D spatial pulses. A comparison of the two k-space trajectories lends considerable insight into the nature and placement of the artifacts. We shall denote the conjugate frequency variable, time, as $k_\omega$ to be consistent with the k-space analysis.

Figure 12B:
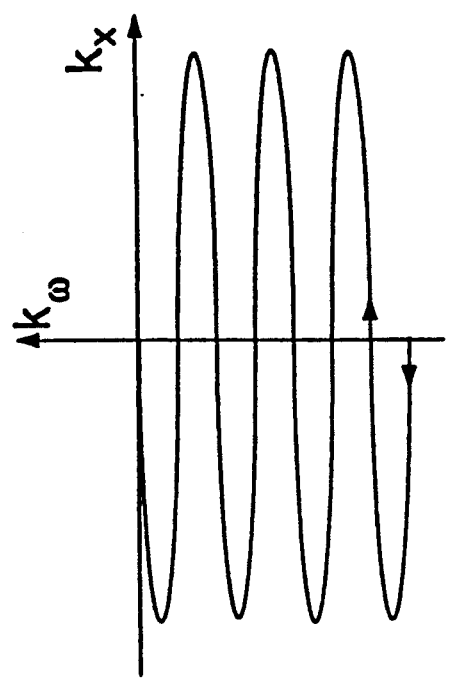
FIG. 12 illustrates a comparison or the k-space coverage of the (a) "blipped" echo planar trajectory used for 2D spatial pulses and the (b) standard echo planar trajectory used for spectral-spatial pulses.
Figure 12A:
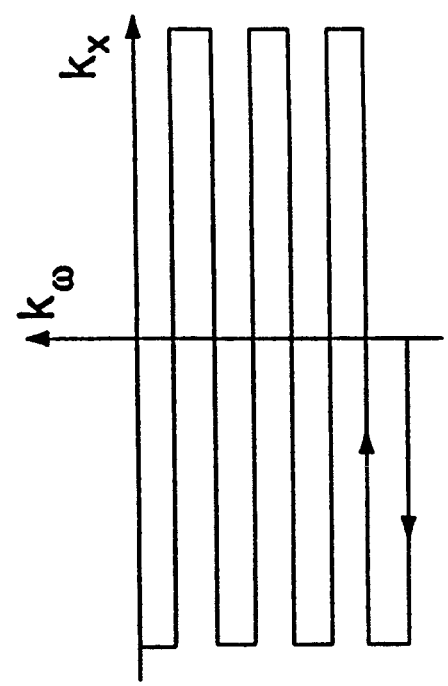
Figure 13:
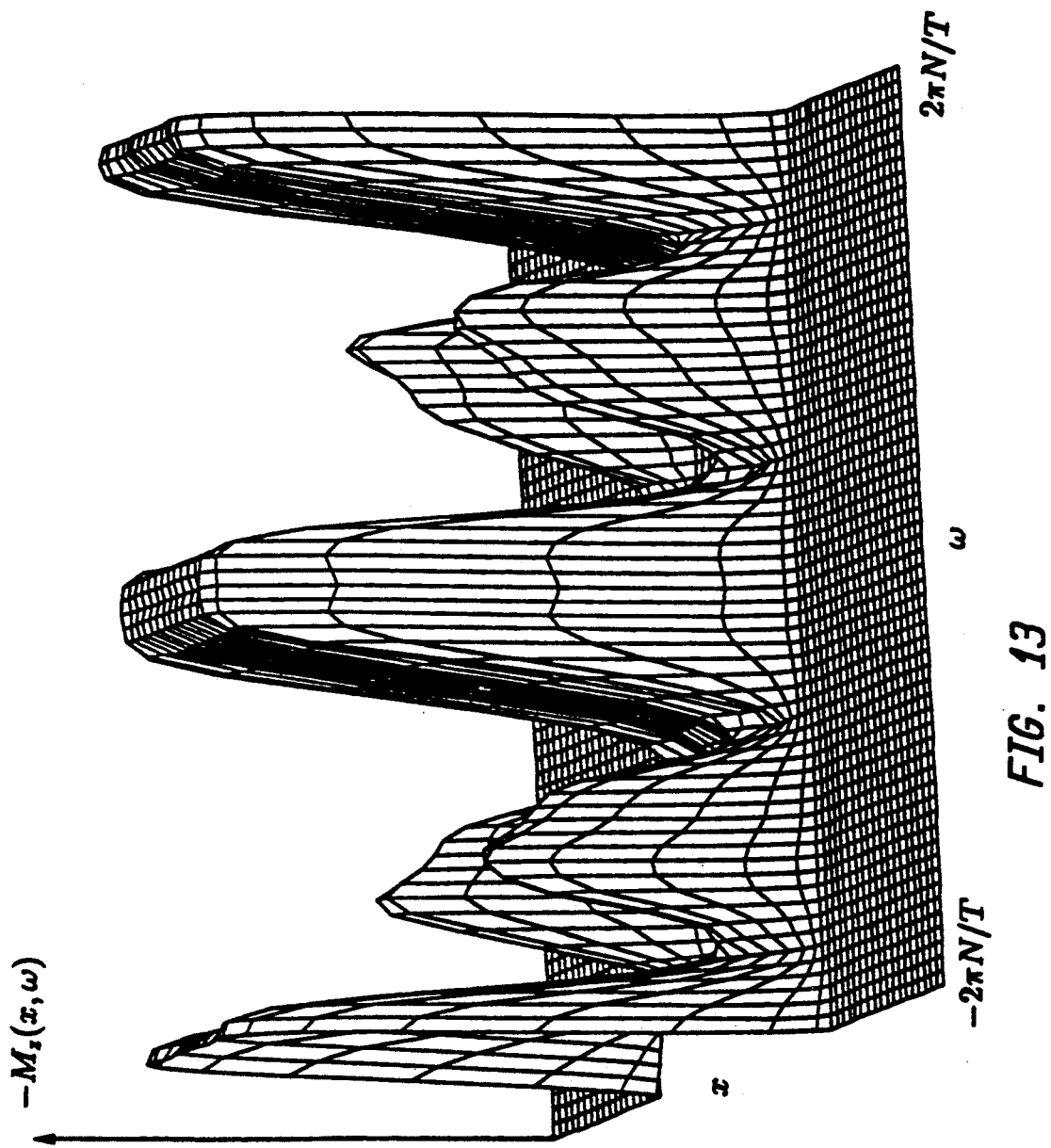
FIG. 13 illustrates the two-dimensional simulation of a sixteen-point spectral-spatial adiabatic pulse.

The two k-space trajectories are plotted in FIG. 12. The 2D spatial pulse traces the standard blipped echoplanar trajectory, which samples $k_y$ space uniformly for all $k_x$. In contrast the spectral-spatial trajectory samples $k_\omega$ space non-uniformly; $k_\omega$ is sampled at half the density at $k_x = k_{max}$ relative to $k_x = 0$. This half-density sampling produces "ghost" replication at half the normal separation in $\omega$. It can be shown using k-space arguments that he ghost replication is zero along the $x=0$ axis. FIG. 13 shows the simulated response to a spectral-spatial pulse, which should be compared with the 2D spatial response in FIG. 11.

This analysis also lends some insight into the off-resonance behavior of the 2D spatial adiabatic pulse. The principal effect is to shift the slice in the y direction, but a secondary artifact is the creation of a ghost artifact at half the replication separation.

Figure 14:
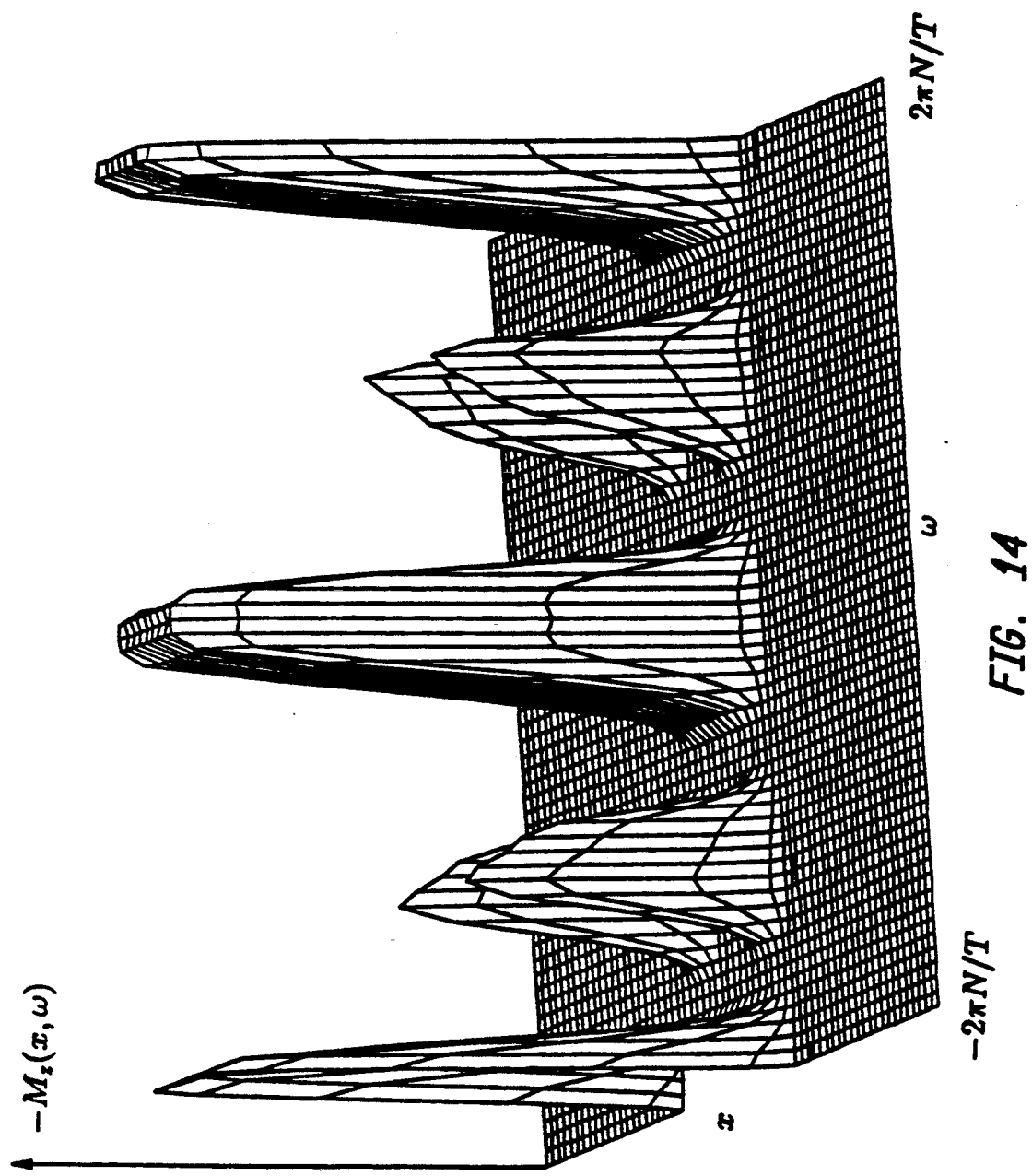
FIG. 14 illustrates the two-dimensional simulation of a twenty-four-point spectral-spatial adiabatic pulse.

For practical spectral-spatial selective inversion, the ghost replication is a serious problem. The simplest solution is to increase the number of sub-pluses to move the ghost side lobes out far enough to suppress a particular metabolite. We have designed a 24-point spectral spatial pulse that has the simulated response shown in FIG. 14. This 24 ms pulse should be useful provided that all species of interest have sufficiently long relaxation times.

EXPERIMENTAL RESULTS

Figure 15:
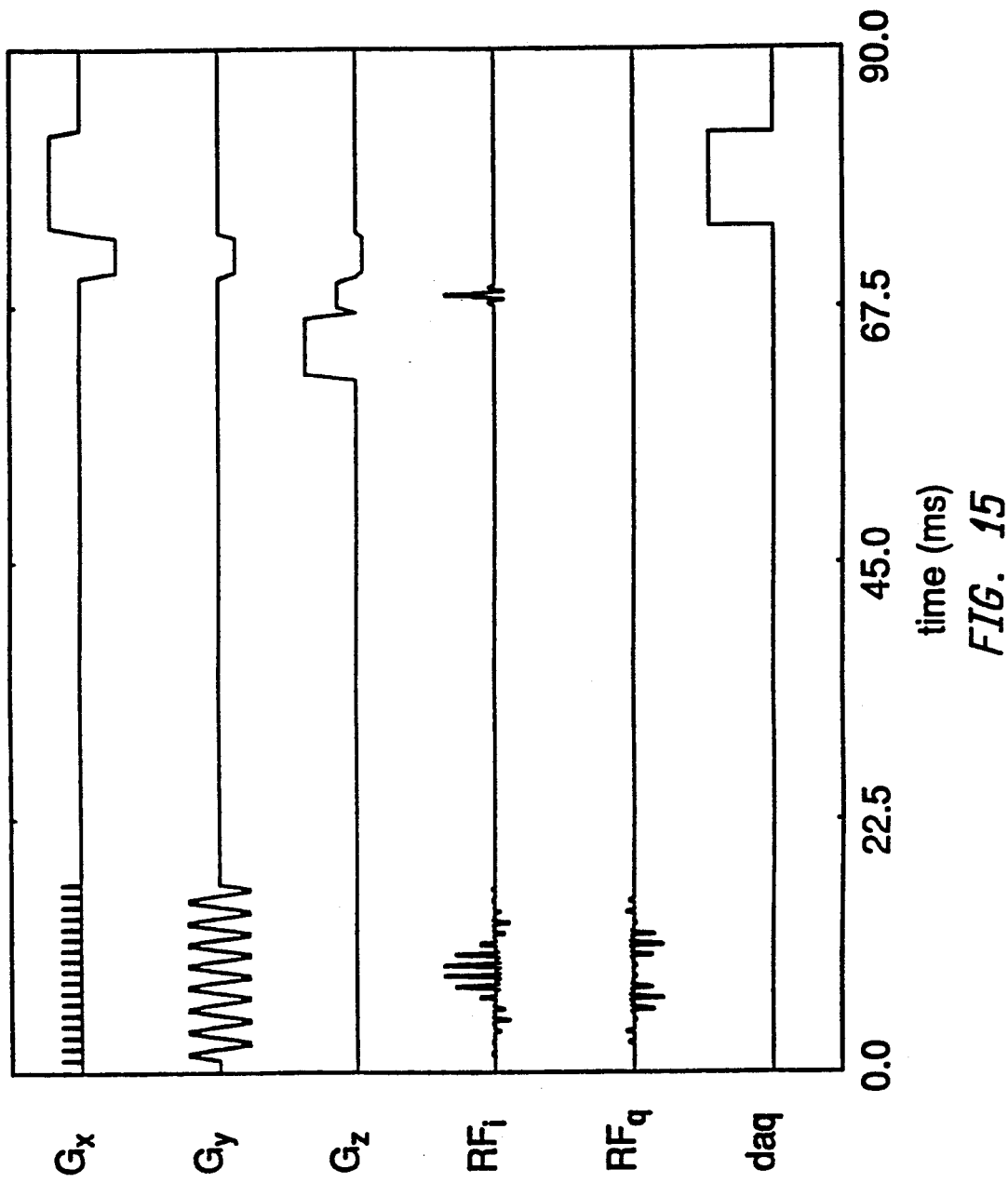
FIG. 15 illustrates the pulse sequence used to test the sixteen-pint spatial inversion pulse on a 1.5T GE Signa system.
Figure 16A:
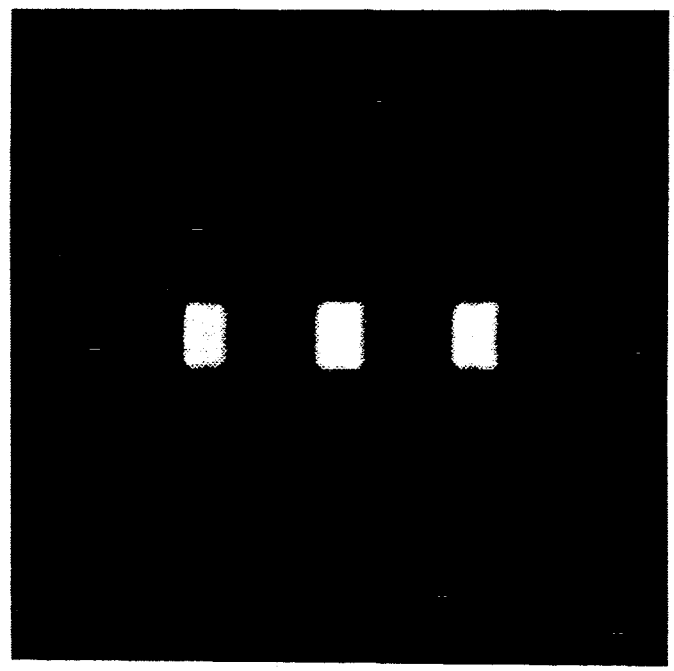
FIG. 16A illustrates the experimental image of the inversion profile obtained using the pulse sequence shown in FIG. 15.
Figure 16B:
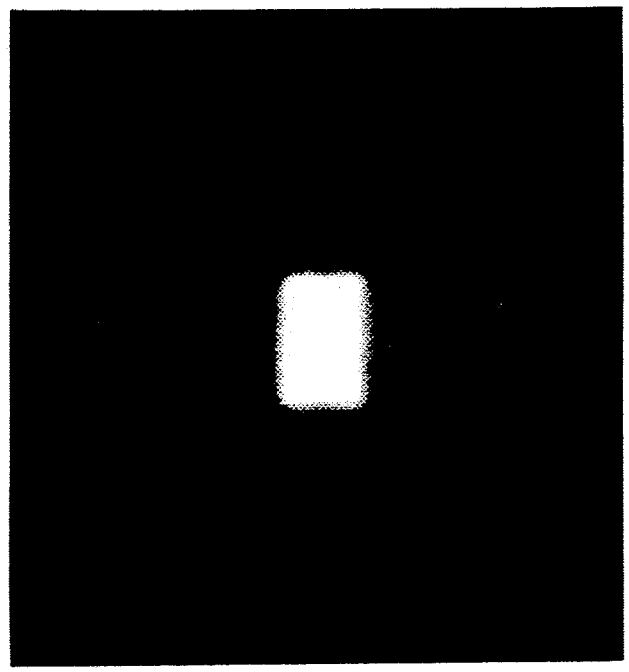
FIG. 16B illustrates the experimental image obtained with both gradient amplitudes set a 0.25 G/cm.

FIG. 15 shows an experimental pulse sequence used to test the 2D pulse on a 1.5 T GE Signa system with shielded gradients. We acquire one FID with an inversion and one with no inversion and then subtract. FIGS. 16A and 16B show experimental images of the inverted region. The inversion profile was very insensitive to changes in the RF amplitude.

In summary, using the technique of separable k-space excitation, we have designed a selective adiabatic pulse that inverts magnetization from a square region in the xy plane with insensitivity to RF variations. In addition, $B_0$ inhomogeneity simply shifts the selected region in the y direction. The only drawbacks of the pulse are its duration ($\approx 16$ ms), and the presence of replicated side lobes which need to be placed outside of the field of view. The spatial two-dimensional pulse is useful for many MR imaging or spectroscopy applications including tagging blood in Selective Inversion Recovery Angiography, restricted inversion in the presence of a surface coil, and 2D field-of-view restriction for projection reconstruction or fast imaging. The spectral-spatial pulse is useful for multi-$T_1$ STIR sequences, or for collecting very late echoes from metabolites such as lactate.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of inverting a region in the plane of an object using selective adiabatic nuclear magnetic resonance RF pulses comprising the steps of
   a) placing said object in a static magnetic field,
   b) applying a sequence of one dimensional selective sub-pulses, said sub-pulses rotating spins with nearly identical rotation profiles, each sub-pulse having a rotation angle determined by sampling of one of said adiabatic nuclear magnetic resonance RF pulses, and
   c) concurrently with step (b) applying a time varying magnetic gradient along said one axis (x) and consistent with each of said RF sub-pulses.

2. The method as defined by claim 1 and further including the following step:
   (d) applying a plurality of magnetic gradient lobes along another axis (y) with each lobe centered at a null between said sub-pulses.

3. The method as defined by claim 2 and further including the following step:
   (e) detecting signals from nuclei in said region.

4. The method as defined by claim 1 wherein step (c) includes alternating polarity of said magnetic gradient along said one axis (x) for successive sub-pulses.

5. The method as defined by claim 4 wherein said magnetic gradient along said one axis (x) has a generally W-shaped magnitude configuration for each polarity.

6. The method as defined by claim 4 wherein said magnetic gradient along said one axis (x) has a generally triangular-shaped magnitude configuration for each polarity.

7. Apparatus for inverting a region in the plane of an object using selective adiabatic nuclear magnetic resonance RF pulses comprising
   a) means for establishing a static magnetic field along one axis (z),
   b) means for applying a sequence of one dimensional selective sub-pulses, said sub-pulses rotating spins with nearly identical rotation profiles, each sub-pulses having a rotation angle determined by sampling of one of said adiabatic nuclear magnetic resonance RF pulses, and
   c) means for concurrently applying a time varying magnetic gradient along said one axis (x) and consistent with each of said RF sub-pulses.

8. Apparatus as defined by claim 7 and further including the following step:
   d) means for applying a plurality of magnetic gradient lobes along another axis (y) with each lobe centered at a null between said sub-pulses.

9. Apparatus as defined by claim 7 and further including means for detecting signals from nuclei in said region.

10. Apparatus as defined by claim 7 wherein said means for applying a magnetic gradient along said one axis (x) alternates polarity of said magnetic gradient along said one axis (x) for successive sub-pulses.

11. Apparatus as defined by claim 7 wherein said means for applying a magnetic gradient along said one axis (x) alternates polarity of said gradient for successive sub-pulses.

12. Apparatus as defined by claim 11 wherein said magnetic gradient along said one axis (x) has a generally W-shaped magnitude configuration for each polarity.

13. Apparatus as defined by claim 11 wherein said magnetic gradient along said one axis (x) has a generally triangular-shaped magnitude configuration for each polarity.

* * * * *